United States Patent [19]

Vander Mey

[11] 4,426,311

[45] * Jan. 17, 1984

[54] METHYLENE CHLORIDE-METHANE SULFONIC ACID STRIPPING COMPOSITIONS AND METHODS FOR USING SAME

[75] Inventor: John E. Vander Mey, Stirling, N.J.

[73] Assignee: Allied Corporation, Morris Township, Morris County, N.J.

[*] Notice: The portion of the term of this patent subsequent to Aug. 21, 1996 has been disclaimed.

[21] Appl. No.: 333,946

[22] Filed: Dec. 23, 1981

Related U.S. Application Data

[63] Continuation of Ser. No. 166,502, Jul. 7, 1980, abandoned.

[51] Int. Cl.$^3$ .......................... C11D 7/08; C11D 7/52
[52] U.S. Cl. ..................................... 252/143; 252/162; 252/171; 252/DIG. 8; 430/329; 134/3; 134/38
[58] Field of Search ......... 252/143, 162, 171, DIG. 8; 430/329; 134/3, 38

[56] References Cited

U.S. PATENT DOCUMENTS

| | | | |
|---|---|---|---|
| 3,391,084 | 7/1968 | York | 252/137 |
| 3,762,952 | 10/1973 | Gouin et al. | 252/548 |
| 3,789,007 | 1/1974 | Robinson | 252/171 |
| 4,165,295 | 8/1979 | Vander Mey | 252/143 |

FOREIGN PATENT DOCUMENTS 1912713 10/1969 Fed. Rep. of Germany .

*Primary Examiner*—John E. Kittle
*Assistant Examiner*—Robert A. Wax
*Attorney, Agent, or Firm*—Arthur J. Plantamura; Jay P. Friedenson; Richard C. Stewart

[57] ABSTRACT

Methylene chloride-methane sulfonic acid compositions used in removing polymeric organic substances from inorganic substrates, such as polymeric adhesives from metal and lense glass parts and positive and negative photoresists from metallized silicon/silicon dioxide wafers, which comprise an effective amount, usually about 1 to 40 percent by weight methane sulfonic acid and the balance methylene chloride are described. Methods for using the above composition at ambient temperatures to remove the polymeric organic substances from the metal and non-metallic inorganic substrates are also described.

21 Claims, No Drawings

METHYLENE CHLORIDE-METHANE SULFONIC ACID STRIPPING COMPOSITIONS AND METHODS FOR USING SAME

This application is a continuation of application Ser. No. 166,502, filed July 7, 1980 now abandoned.

BACKGROUND OF THE INVENTION

This invention relates to organic stripping compositions containing methylene chloride and methane sulfonic acid which are useful in removing polymeric organic substances such as photoresists, rubber adhesives, etc. from inorganic substrates.

During manufacture of semi-conductors and semi-conductor microcircuits, it is frequently necessary to coat the materials from which the semi-conductors and microcircuits are manufactured with a polymeric organic substance which is generally a photoresist, i.e., a substance which forms an etch resist upon exposure to light. Subsequently, the polymeric organic substance must be removed from the surface of the inorganic substrate which is typically a silicon dioxide coated silicone wafer and may also contain metallic microcircuitry, such as aluminum, on the surface. Therefore, there is need for improved stripping compositions which will remove the polymeric organic substance from the coated inorganic substrate without corroding, dissolving or dulling the surface of the metallic circuitry or chemically altering the inorganic substrate.

Prior art methods are known for removing such polymeric organic substances by use of organic compositions containing phenol and linear alkylbenzenesulfonic acids, as exemplified in U.S. Pat. No. 3,871,928 (Schevey, Kremers to Allied Chemical, issued March, 1975) or containing linear alkylbenzenesulfonic acids and aromatic, aliphatic or chlorinated aliphatic and aromatic solvents, as disclosed in U.S. Pat. No. 4,242,218 (Vander Mey to Allied Chemical, issued December, 1980).

Stripping compositions containing tetrachloroethylene, and ortho-dichlorobenzene, dodecyl sulfonic acid, and formic acid are disclosed in U.S. Pat. No. 4,187,191 (Simpson to General Motors, issued Feb. 5, 1980).

Stripping solutions containing a surfactant, alkylarylsulfonic acid, a hydrotropic aromatic sulfonic acid and a halogen-free aromatic hydrocarbon solvent with a boiling point above 150° C. are disclosed in U.S. Pat. No. 4,165,294 (Vander Mey to Allied Chemical, issued, August 1979).

Organic compositions containing at least about 0.05% of anhydrous hydrofluoric acid as a stripping agent and organic solvents and solubilizing agents for the hydrofluoric acid, for removing paint from metallic surfaces, are known in the prior art, as exemplified in U.S. Pat. No. 3,335,087 (Keers to Pennsalt, issued August, 1967), and U.S. Pat. No. 3,335,088 (Mandell to Pennsalt, issued August, 1967).

In U.S. Pat. No. 4,165,295 (Vander Mey to Applied Chemical, issued August, 1979) there is disclosed an improved organic stripping composition useful for removing organic polymeric substances and photoresist, and containing alkylsulfonic or monoalkylarylsulfonic acid, an aromatic or isoparaffin hydrocarbon solvent, optionally phenol and stabilized against metal corrosion by addition thereto of 5 to 250 ppm of fluoride ion.

Prior art inorganic stripping compositions for removing polymeric organic substances comprise aqueous sulfuric acid compositions containing at least about 300 ppm of fluoride ion to reduce metallic dulling and corrosion, as exemplified in U.S. Pat. No. 3,932,130 (Bennett, Brockington to Texaco, issued January, 1976), U.S. Pat. No. 3,654,001 (Mann to North American Rockwell, issued April 1972) and U.S. Pat. No. 3,060,071 (Kinder to Allied Chemical, issued October 1962).

However, some of the above-mentioned photoresist removal applications require the presence of fluoride ion stabilizers to prevent metallic, especially aluminum corrosion. Furthermore, most of these organic stripping compositions operate at elevated temperatures.

It is an object of this invention to provide an organic stripping composition which operates without added flouride ion at room temperature to cleanly, effectively and quickly remove organic photoresist materials from metallized inorganic substrates, particularly aluminized silicon dioxide, without causing substantial etching of the inorganic substrate or corrosion and dulling of the metallic circuitry on the surface of the inorganic substrate. It is also an object of this invention to provide a method for removing polymeric organic substances, rubber adhesives and the like from substances of metallized inorganic substances or metals particularly aluminum or aluminized silicon dioxide, without causing etching of the metal or the inorganic substrate or corrosion and dulling of the metallic circuitry on the surface of the inorganic substrate.

SUMMARY OF THE INVENTION

In accordance with this invention there is provided a stripping composition for removing polymeric organic substances from an inorganic substrate, the stripping composition comprising methylene chloride and an effective amount of methane sulfonic acid.

Also in accordance with this invention there is provided methods for stripping polymeric organic substances (i.e., positive and negative photoresists or organic polymeric rubber adhesives) from inorganic substrates comprising contacting the polymeric organic substance with the organic stripping composition of this invention for a period of time sufficient to remove said polymeric substances.

DETAILED DESCRIPTION OF THE INVENTION AND PREFERRED EMBODIMENTS

The present invention provides a stripping composition which quickly and effectively removes polymeric organic substances from inorganic substrates, metallic, non-metallic and metallized non-metallic substrates and methods of using same. The stripping composition comprises methylene chloride and an effective amount of methane sulfonic acid in the range of about 1 weight percent to about 40 weight percent of the composition. An upper limit on the effective amount of methane sulfonic acid has not been found to be critical; an amount of methane sulfonic acid in excess of 1 weight percent in methylene chloride has been found effective. Only economic considerations would preclude employing an effective amount of methane sulfonic acid in excess of 40 weight percent of the composition.

The methylene chloride-methane sulfonic acid stripping compositions of the present invention comprising about 1 to about 40 weight percent of methane sulfonic acid and about 99 to about 60 weight percent of methylene chloride operate at ambient temperatures, conveniently in the range of from about 15° to about 40° C. to remove a variety of polymeric organic materials including photoresists, paints, varnishes, or rubber adhesives from inorganic substrates both metallic and non-metallic in a period of about 1 to 2 minutes, without use of phenol or phenol compounds or higher boiling chlorinated or aliphatic hydrocarbons or aromatic sulfonic acids. The temperature employed has not been found to be critical; any ambient temperature conveniently in the range of from about 15° C. to about 40° C. has been found effective for proper operation of the stripping compositions the present invention. Since methylene chloride has a boiling point of 40° C. at barometric pressure, only economic considerations would preclude using a temperature in excess or 40° C.

In addition, the methylene chloride-methane sulfonic acid stripping compositions quickly and effectively remove organic polymers from metallized and metallic surfaces without attacking the metal surface, and without using fluoride ion which was previously used as a metal corrosion inhibitor as exemplified in U.S. Pat. No. 4,165,294 and 4,165,295 (both issued in August, 1979 Vander Mey to Allied Chemical). Aluminum foil, immersed in a 10 percent by weight methane sulfonic acid-90 weight percent methylene chloride solution at 23° C. for 24 hours showed less than 0.1 Å/minute corrosion.

The present invention also includes a method of removing an organic polymeric material from an inorganic substrate which comprises contacting the polymeric organic substance with the methane sulfonic acid-methylene chloride stripping composition for a period of time sufficient to remove the polymeric substances.

The stripping composition of the present invention comprising methylene chloride and about 1 to about 40 weight percent, preferably about 1 to about 5 weight percent methane sulfonic acid removed, at ambient temperature, the excess organic polymeric rubber adhesive, e.g., a polysulfide elastomer, EC-801 available from the 3M Co., St. Paul, MN 55101, used to hold photographic lenses in a metallic (e.g., magnesium, brass or aluminum,) housing. Surprisingly, it was discovered that a stripping composition comprising 5 weight percent methane sulfonic acid in methylene chloride removed the rubber adhesive used to set the lenses in the metal housings more quickly than a 30 weight percent methane sulfonic acid, 70 weight percent methylene chloride solution. The presence of 1 to 40 weight percent, preferably 1 to 5 weight percent methane sulfonic acid has been found effective to remove the polymeric rubber adhesive from the lens housing assembly. However, an upper limit on the effective amount of methane sulfonic acid has not been found to be critical; only economic consideration would preclude using an effective amount in excess of 40 weight percent methane sulfonic acid.

Methylene chloride, per se, failed to loosen and remove the rubber adhesive; immersion of a rubber coated lens in a metal housing in methylene chloride for two weeks at 23° C. swelled but failed to remove the adhesive. A one weight percent methane sulfonic acid methylene chloride stripping composition started to attack the adhesive rubber coating (EC-801) on the lens-metal housing in contact therewith after 30 seconds at 23° C. The temperature has not been found to be critical; any convenient ambient temperature can be employed for effective operation of the stripping compositions of the present invention.

The stripping composition containing about 1 to about 40 weight percent methane sulfonic acid and about 99 to about 60 weight percent methylene chloride, preferably about 20 weight percent methane sulfonic acid and about 80 weight percent methylene chloride effectively removes positive and negative photoresist from an inorganic substrate, e.g., silicon dioxide at a temperature of about 20° to 40° C. in 1 to 2 minutes.

The polymeric organic substances which are removed by the stripping solutions of this invention are photoresists which generally comprise polymers selected from polyisoprenes, polyvinyl cinnamates and phenol formaldehyde resins. These photoresists are applied to an inorganic substrate, e.g., aluminum, silicon, silicon dioxide or silicon dioxide metallized with aluminum and portions thereof are masked. The masked substrate is then exposed to ultra violet (UV) light, e.g., a 120 volt 650 watt quartz lamp for 1–15 seconds at a distance of 6–12 inches, to harden the exposed photoresist. For negative photoresists, the portion of the photoresist which is not exposed, i.e., masked from the light, is then removed by a mild solvent which does not dissolve the exposed photoresist. Thus, a pattern, e.g., a portion of an electrical circuit pattern, is left on the exposed substrate. For positive photoresists, the portions of positive photorest exposed to UV light are removed. The remaining positive photoresist is then baked for further hardening and the portion of the substrate which is not covered by the photoresist is etched or otherwise treated. The etchant may be a buffered oxide etchant, e.g. NH$_4$F/HF, acid, base or plasma etchant, e.g. CF$_4$ which may further harden the photoresist. The hardened photoresist must be removed before the substrate can be further processed or used. In employing the stripping solutions of this invention, the substrate covered with the baked photoresist is contacted with the stripping solution at any temperature ambient, conveniently in the range of about 15° to about 40° C.; the temperature employed for effective operation of present invention is not critical. Times required for stripping the photoresist vary to quite an extent depending on the specific polymer used in the photoresist and the photoresist prefacing conditions. Generally, the time involved will be between 1 and 10 minutes, although some photoresists depending on the baked temperature, may require 15, 30 minutes or even an hour of contact with stripping solutions before the polymeric photoresist is completely loosened or removed from the substrate. It should be appreciated that many photoresists are completely removed from the substrate while others may be loosened, and then floated off and then dissolved in the stripping composition. Among the photoresists which may be stripped by the compositions of the present invention, the positive and negative resists listed in the table below are exemplary:

TABLE

| Type | Trademarks | Source |
|---|---|---|
| Negative | | |
| Polyisoprene | Microneg 752 or 747 | Eastman Kodak Co. |
| | Waycoat IC or SC | Philip A. Hunt, Inc. |
| | Waycoat HR-100 or HR-200 | Philip A. Hunt, Inc. |
| | KTFR, KMER | Eastman Kodak Co. |
| Polyvinyl Cinnamate | KPR | Eastman Kodak Co. |
| Positive | | |
| Phenol Formaldehyde | Shipley AZ 1350 or AZ 111 | Shipley Co. Inc. |
| | Waycoat HR-104 or | Philip A. Hunt, Inc. |

TABLE-continued

| Type | Trademarks | Source |
|---|---|---|
| | HP-204 | |
| | Micropos 809 | Eastman Kodak Co. |

It is to be understood that other positive and negative photoresists having a broad range of molecular weights can be effectively removed by the stripping, composites of the present invention.

After the photoresist has been stripped from the substrate, the substrate may then be rinsed in water, methylene chloride, isopropanol, trichloroethane, trichloroethylene, or mixtures thereof; other rinsing solvents well known to one of ordinary skill in the art may also be used.

Among inorganic substrates found useful in the present invention are gadolinium gallium garnet, gallium arsenide, sapphire, silicon on sapphire, silicon or silicon dioxide and silicon or silicon dioxide metallized with aluminum or nickel-chromium. Other inorganic substrates conveniently used in the art are also considered within the scope of the present invention.

In preferred embodiments of the present method, a 20 weight percent methane sulfonic acid-methylene chloride solution completely removed photoresist, e.g. positive photoresist (Shipley Co.'s AZ-1350 baked at 160° C. for 30 minutes) or negative photoresist (Waycoat HR-100 baked at 170° C. for 30 minutes) from a silicon dioxide substrate at 23° C. in 1 to 2 minutes. While amounts of methane sulfonic acid less than 20 weight percent were effective in removing both baked-temperature treated positive and negative photoresists from silicon dioxide at 23° C., longer times were required for complete removal. While stripping compositions containing effective amounts of methane sulfonic acid greater than about 20 weight percent will also effect the removal of photoresist, economic considerations make the 20 weight percent methane sulfonic acid-methylene chloride composition the preferred one. While stripping compositions in the method of the present invention operate in a still bath at about 23° C., other temperatures and apparatus are considered within the scope of this invention. If the stripping compositions of the present invention are used in a vapor degreaser apparatus maintained at a temperature of about 40° C., the time required for the stripping solution to completely remove the polymeric organic coating, i.e., positive negative photoresists or rubber adhesive would be ⅛ of the stripping time required at 23° in a still bath. In another embodiment of the present invention the stripping composition operates to remove polymeric organic substances within applied ultrasonic energy. In a specific embodiment a vapor degreaser ultrasonics unit with a spray attachment and an outside tank for collecting the methylene chloride vapor vaporized at the operating temperature effectively removed polymeric organic substances at 40° C.

The stripping composition of the present invention comprising methylene chloride and an effective amount of methane sulfonic acid has also been found effective in removing polymeric organic substances from a mask used in the photolithograh process.

In the photolithography process, a photoresist whose structure changes upon exposure to light and, especially ultra violet light, is coated on an inorganic substrate described above. Light, passing through a mask of a desired pattern exposes selected portions of the photoresist which, with negative photoresists, become crosslinked in those portions; with positive photoresists, the exposed portions are rendered more soluble in alkali media than the unexposed portions. Photoresist, positive and negative, which may adhere to the mask must be removed for proper operation of the mask. Thus in accordance with the present invention, the polymeric organic photoresists are removed from the masks used in photolithography by contacting said masks with a stripping composition, comprising methylene chloride and an effective amount of methane sulfonic acid for a period of time sufficient to remove said polymeric organic photoresists. The methylene chloride-methane sulfonic acid stripping compositions of the present invention found useful to remove the photoresists from the mask comprises about 1 to about 40 weight percent, preferably about 20 to about 40 weight percent methane sulfonic acid. An upper limit on the effective amount of methane sulfonic acid has not been found to be critical; only economic considerations preclude employing an effective amount in excess of 40 weight percent methane sulfonic acid.

Temperature of the contact is not critical; any convenient temperature, usually ambient temperature in the range of from about 15° C. to about 40° C. can be employed for proper operation of the stripping compositions of the present invention.

The masks used in photolithography comprise optical grade glass having a pattern placed thereon. The pattern can be of any design and is usually formed of a metallic substance selected from the group consisting of chromium, chromium oxide and iron oxide. Other metals commonly used in photolithography are also considered within the scope of the present invention.

After the photoresist has been removed from the mask, the mask may then be rinsed with water, methylene chloride, isopropanol, trichloroethane, trichloroethylene or mixtures thereof.

We claim:

1. A stripping composition capable of removing polymeric organic substances from an inorganic substrate at a temperature of from about 15° C. to about 40° C., the stripping composition comprising methylene chloride and methane sulfonic acid in an amount effective for removal of the organic polymeric substances.

2. The stripping composition of claim 1 wherein the amount of methane sulfonic acid is about 1 to about 40 weight percent of the composition.

3. The stripping composition of claim 1 wherein the amount of methane sulfonic acid is about 1 to about 5 weight percent of the composition.

4. The stripping composition of claim 1 wherein the amount of methane sulfonic acid is about 25 to about 40 weight percent of the composition.

5. A method for removing polymeric organic substances from an inorganic substrate which comprises contacting the polymeric substance with the composition of claim 1 at a temperature of from about 15° C. to about 40° C. for a period of time sufficient to remove said substance.

6. The method as described in claim 5 wherein the temperature of the contact is from about 15° to about 40° C.

7. The method described in claim 5 wherein further comprises applying ultrasonic energy.

8. The method as described in claim 5 wherein the polymeric organic substance is a photoresist selected from the group consisting of polyisoprenes, polyvinyl cinnamates and phenol formaldehyde resins.

9. The method as described in claim 5 wherein the inorganic substrate is gadolinium gallium garnet, gallium arsenide, sapphire, silicon on sapphire, silicon, silicon dioxide, or silicon or silicon dioxide metallized with aluminum or nickel-chromium.

10. A method for removing polymeric organic substances from a mask used in photolithography comprising contacting said polymeric organic substance with a stripping composition of claim 1 for a period of time sufficient to remove said substances.

11. A method as described in claim 10 wherein the stripping composition contains from about 1 to about 40 weight percent methane sulfonic acid.

12. A method as described in claim 10 wherein the stripping composition contains from about 20 to 40 weight percent methane sulfonic acid.

13. A method as described in claim 12 wherein the mask comprises an optical grade glass with a pattern thereon formed from a material selected from the group consisting of chromium, chromium oxide and iron oxide.

14. A method as described in claim 10 wherein the polymeric organic substance is a photoresist selected from the group consisting of polyisoprenes, polyvinylcinnamates and phenol formaldehyde resins.

15. A method of removing organic polymeric rubber adhesive used to bond a photographic lens in a metal housing which comprises contacting the polymeric rubber adhesive with the composition of claim 1 for a period of time sufficient to remove said rubber material.

16. A method as described in claim 15 wherein the stripping composition contains from about 1 to about 40 percent by weight methane sulfonic acid.

17. A method as described in claim 15 wherein the stripping composition contains from about 1 to about 5 weight percent by weight methane sulfonic acid.

18. A method as described in claim 15 wherein the temperature is about 15° to about 40° C.

19. A method as described in claim 15 wherein the polymeric rubber adhesive is a polysulfide elastomer.

20. A stripping composition capable of removing polymeric organic substances from an inorganic substrate at a temperature of from about 15° C. to about 40° C., said composition consisting essentially of from about 99 to about 60 weight percent of methylene chloride and from about 1 weight percent to about 40 weight percent of methane sulfonic acid.

21. A method for removing polymeric organic substances from an inorganic substrate which comprises contacting the polymeric organic substances with a stripping composition comprising from about 99 to about 60 weight percent methylene chloride and from about 1 to about 40 weight percent methane sulfonic acid at a temperature of from about 15° C. to about 40° C. for a period of time sufficient to remove said polymeric organic substances.

* * * * *